(12) United States Patent
Landesberger et al.

(10) Patent No.: US 10,752,499 B2
(45) Date of Patent: Aug. 25, 2020

(54) METHOD FOR MANUFACTURING PLANAR THIN PACKAGES

(71) Applicant: Fraunhofer-Gesellschaft zur Förderung der angewandten Forschung e.V., Munich (DE)

(72) Inventors: Christof Landesberger, Gräfelfing (DE); Indranil Bose, Munich (DE)

(73) Assignee: FRAUNHOFER-GESELLSCHAFT ZUR FÖRDERUNG DER ANGEWANDTEN FORSCHUNG E.V., Munich (DE)

(*) Notice: Subject to any disclaimer, the term of this patent is extended or adjusted under 35 U.S.C. 154(b) by 0 days.

(21) Appl. No.: 16/179,936

(22) Filed: Nov. 3, 2018

(65) Prior Publication Data
US 2019/0135618 A1    May 9, 2019

(30) Foreign Application Priority Data

Nov. 7, 2017   (DE) .......................... 10 2017 219 711

(51) Int. Cl.
| H01L 21/3105 | (2006.01) |
| B81C 1/00 | (2006.01) |
| B81B 7/00 | (2006.01) |
| H01L 23/13 | (2006.01) |
| H01L 23/538 | (2006.01) |

(Continued)

(52) U.S. Cl.
CPC .......... *B81C 1/00301* (2013.01); *B81B 7/007* (2013.01); *H01L 21/31051* (2013.01); *H01L 23/13* (2013.01); *H01L 23/5389* (2013.01); *H01L 24/32* (2013.01); *H01L 24/83* (2013.01); *H01L 25/0657* (2013.01); *H01L 25/50* (2013.01); *B81B 2201/0264* (2013.01); *B81C 2201/0104* (2013.01);
(Continued)

(58) Field of Classification Search
CPC .................................................. H01L 2224/11
See application file for complete search history.

(56) References Cited

U.S. PATENT DOCUMENTS

| 6,492,699 B1 | 12/2002 | Glenn et al. | |
| 8,704,349 B2 * | 4/2014 | Chow | H01L 21/561 257/686 |

(Continued)

FOREIGN PATENT DOCUMENTS

EP    1680803 B1    5/2016

OTHER PUBLICATIONS

European Search Report dated Mar. 18, 2019, issued in application No. EP 18 204 901.5.

*Primary Examiner* — Thao P Le
(74) *Attorney, Agent, or Firm* — McClure, Qualey & Rodack, LLP.

(57) ABSTRACT

A method for manufacturing a semiconductor device package includes providing an electrically insulating film having film terminal contacts on a surface thereof, and an opening therethrough. A semiconductor device arrangement at least including a carrier element having arranged thereon a projecting element and element terminal contacts is deposited on the film, wherein the projecting element is introduced into the opening and the element terminal contacts are arranged in contact with the film terminal contacts. The planarization layer is deposited over the carrier element and the film.

14 Claims, 5 Drawing Sheets

(51) Int. Cl.
*H01L 23/00* (2006.01)
*H01L 25/065* (2006.01)
*H01L 25/00* (2006.01)

(52) U.S. Cl.
CPC ............... *B81C 2203/0136* (2013.01); *H01L 2224/32145* (2013.01); *H01L 2224/32225* (2013.01)

(56) References Cited

U.S. PATENT DOCUMENTS

| | | | |
|---|---|---|---|
| 2001/0034083 A1* | 10/2001 | Coyle | B29C 45/14655 438/127 |
| 2005/0087356 A1* | 4/2005 | Forcier | B81C 1/0023 174/558 |
| 2007/0166867 A1 | 7/2007 | Chow et al. | |
| 2009/0127716 A1* | 5/2009 | Takatsuki | H01L 21/561 257/777 |
| 2011/0222717 A1* | 9/2011 | Kuratani | H04R 19/005 381/355 |
| 2012/0091594 A1* | 4/2012 | Landesberger | H01L 23/3121 257/774 |
| 2013/0256919 A1 | 10/2013 | Scholz et al. | |
| 2013/0307105 A1 | 11/2013 | Hsu | |
| 2015/0091167 A1 | 4/2015 | Geissler et al. | |

* cited by examiner

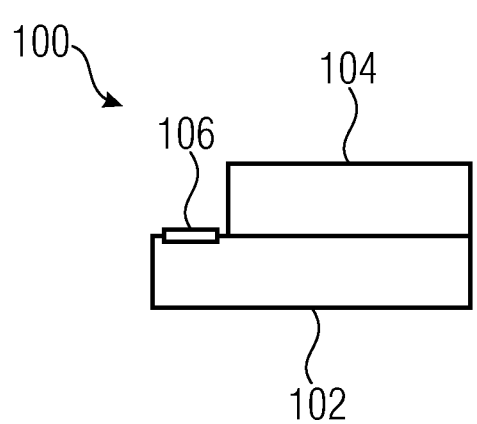
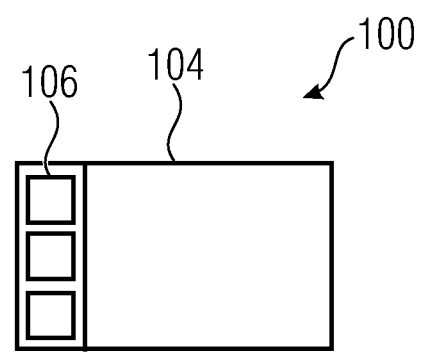
Fig. 2a  Fig. 2b
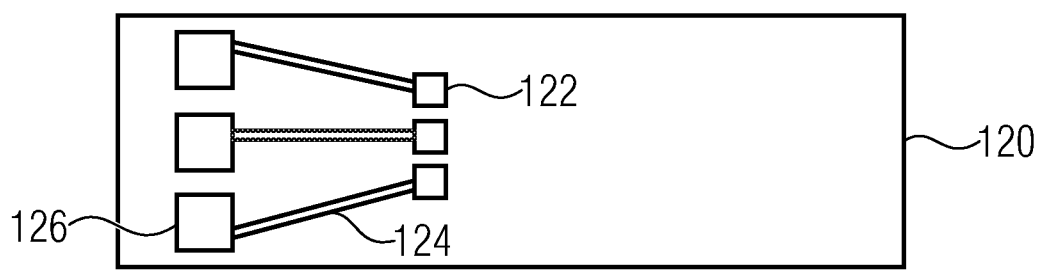
Fig. 3

METHOD FOR MANUFACTURING PLANAR THIN PACKAGES

CROSS-REFERENCE TO RELATED APPLICATION

This application claims priority from German Application No. DE 10 2017 219 711.0, filed Nov. 7, 2017, which is incorporated herein by reference in its entirety.

BACKGROUND OF THE INVENTION

According to conventional technology, MEMS sensors are mounted in a package onto the surface of a printed circuit board or a flexible film. This makes the package thicker at the location of the sensor. In some applications such as flow sensors or pressure sensors in flowing media, it is important for the surface to be smooth and planar in order to not generate whirls and turbulences and to not disturb a laminar flow.

Until now, MEMS sensors were sold packaged in a housing and were mounted on printed circuit boards with these housings. Even small SMD (Surface Mount Device) housings have a thickness in the order of millimeters.

ASICs, controllers and many other circuits made of silicon are also mounted and electrically connected as a bare die (=silicon chips without a housing) on the inside of a printed circuit board. However, there are enclosed on all sides by the printed circuit board and the adhesives in order to be protected from environmental influences such as moisture and corrosion. However, with MEMS sensors such as pressure sensors, a contact is needed at least between the sensitive surface of the silicon chip and the environment. This also applies to other chemical sensors (pH-value, gases and ions in liquids, salt content) and physical sensors (temperature, pressure, sound, radiation, acceleration) if a thin covering layer effects the sensitivity of the sensor as well.

SUMMARY

According to an embodiment, a method for manufacturing a semiconductor device package may have the steps of: providing an electrically insulating film with film terminal contacts on a surface thereof, and an opening therethrough; depositing onto the film a semiconductor device arrangement which at least includes one carrier element having arranged thereon a projecting element and element terminal contacts, wherein the projecting element is introduced into the opening and the element terminal contacts are arranged in contact with the film terminal contacts; depositing a planarization layer over the carrier element and the film.

Another embodiment may have a thin package for a semiconductor device arrangement including a carrier element having arranged thereon a projecting element and element terminal contacts, in a two-sheet film stack, wherein electrically contacting the semiconductor device arrangement to conductive tracks takes place on a surface of one of the films that faces a second one of the films by arranging the element terminal contacts on film terminal contacts that are located on the surface of the one the films, wherein the conductive tracks are guided by means of vias onto one of the outer surfaces, and wherein the projecting element is arranged in an opening of the one of the two films.

Examples of the present disclosure provide a method for manufacturing a semiconductor device package, comprising:

providing an electrically insulating film having film terminal contacts on a surface thereof, and an opening therethrough;

depositing onto the film a semiconductor device arrangement which at least comprises one carrier element having arranged thereon a projecting element and element terminal contacts, wherein the projecting element is introduced into the opening and the element terminal contacts are arranged in contact with the film terminal contacts;

depositing a planarization layer over the carrier element and the film.

Examples of the present invention are based on the finding that a flat, or planar, package (housing) for semiconductor device arrangements may be implemented by depositing a semiconductor device arrangement in such a way onto an electrically insulating film that terminal contacts of the semiconductor device arrangement are arranged directly on film terminal contacts and are connected to the same in an electrically conductive manner, and that an element projecting from the semiconductor device is introduced into an opening formed by the film. Then, a planarization layer may be deposited over the carrier element and the film in order to finish the package. Thus, a package having an overall thickness that is significantly thinner than that of previous housings, e.g., of sensors, may be manufactured. The package may consist of only two sheets of film that laterally surround a semiconductor device arrangement without housing and, thus, do not contribute to the thickness, or of a film with one sheet of embedding material that also laterally surrounds the semiconductor device arrangement without housing and, thus, does not contribute to the thickness. Thus, the whole package may be as thick as or not substantially thicker than the semiconductor device arrangement. In addition, a planar package in which the original topography of the semiconductor device arrangement is balanced may be obtained.

BRIEF DESCRIPTION OF THE DRAWINGS

Embodiments of the present invention will be detailed subsequently referring to the appended drawings, in which:

FIGS. 2a to 10 show schematic illustrations for explaining a further example according to the present disclosure.

DETAILED DESCRIPTION OF THE INVENTION

Figure 1A:
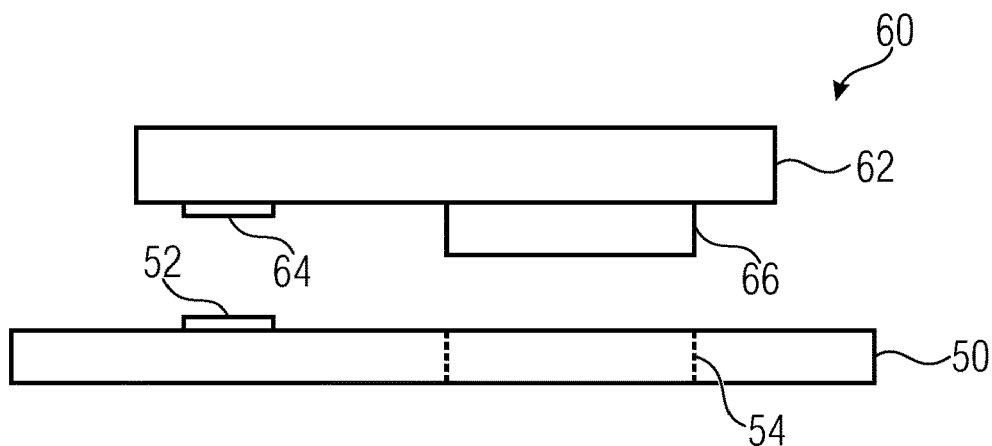
FIGS. 1a to 1c show schematic side views for explaining an example of a method according to the present disclosure.

In the following, examples of the present disclosure are described in detail using the accompanying drawings. It should be noted that, in the drawings, same elements or elements having the same functionality may be provided with the same or similar reference numerals, while a repeated description of such elements may be omitted. Therefore, descriptions for elements having the same or similar reference numerals may be interchangeable.

In the following description, a plurality of details are presented in order to provide a thorough explanation of examples of the present disclosure. However, a person skilled in the art will understand that examples of this disclosure may be practiced without these specific details. In other cases, sufficiently known structures and apparatuses are shown in a schematic sectional view or plane view instead of in detail in order to not obscure the description of examples. In addition, characteristics of the various examples described below may be combined with other characteristics of other examples, unless explicitly stated otherwise.

FIG. 1a schematically shows a side view of a film 50 consisting of an electrically insulating material such as polyimide, PI, or polyethylene naphthalate, PEN. Film terminal contacts 52 are formed on an upper surface of the film. An opening 54, which is indicated by dashed lines in the side view, is formed through the film 50. In examples, the opening 54 penetrates the film completely. In other examples, the opening 54 does not penetrate the film completely, however, this is more complex to manufacture. FIG. 1a further shows a semiconductor device arrangement 60 comprising a carrier element 62, element terminal contacts 64 and a projecting element 66. The terminal contacts 64 and the projecting element are arranged on the same surface of the carrier element 62.

Figure 1B:
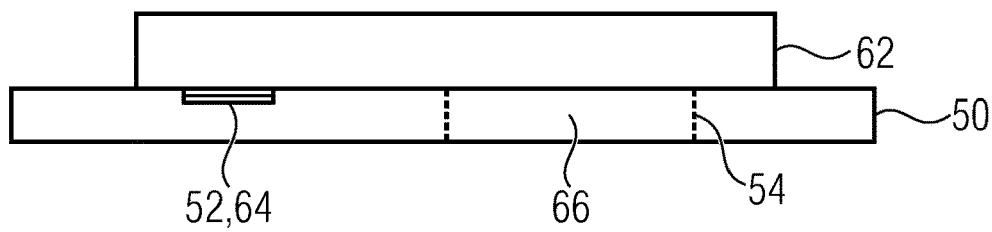

The semiconductor device arrangement is deposited onto the film 50 such that the projecting element is introduced into the opening 54, and the element terminal contacts 64 come to rest on the film terminal contacts 52 and mechanically and electrically contact the same. This is illustrated in FIG. 1b. The terminal contacts may be pressed into the film 50. During this, the semiconductor device arrangement 60 may be attached to the film 50. In examples, the semiconductor device arrangement 60 may be glued onto the film 50. For this, a conductive adhesive may be used in the region of the terminal contacts and/or a non-conductive adhesive may be used in other regions. In examples, an adhesive may be deposited on the region of the film terminal contacts before depositing the semiconductor device arrangement. In other examples, the semiconductor device arrangement 60 may be attached to the film 50 by means of a heating method. As is shown in FIG. 1b, the projecting element 66 may terminate flush with the surface of the film 50 at the side facing away from the terminal contacts 52, 64, i.e., the lower side in the figures.

Subsequently, a planarization layer 70 is deposited over the carrier element 62 and the film 50. In examples, the planarization layer 70 may consist of a permanent resist, an epoxy or a polymer. The package 80 manufactured in such a way is shown in FIG. 1c.

Figure 1C:
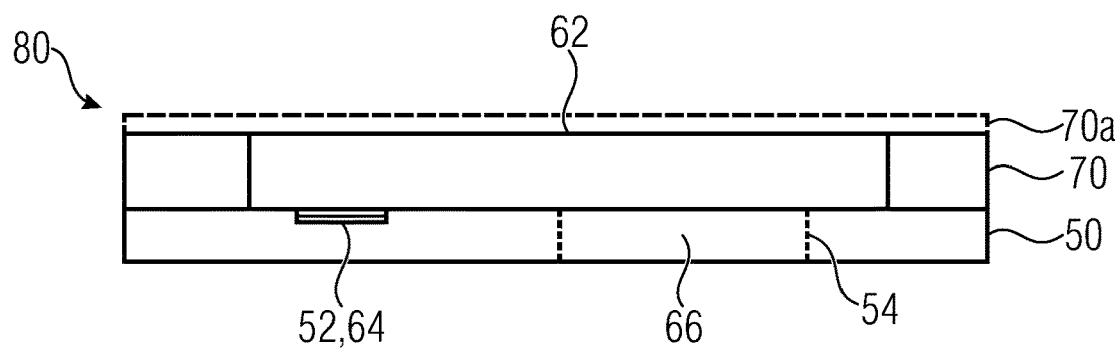

As is shown in FIG. 1c, the planarization layer may terminate flush with the surface of carrier element 62 on the side facing away from the projecting element 66. In such examples, the film 50 laterally surrounds the projecting element, and the planarization layer laterally surrounds the carrier element 62. On the side of the carrier element 62 facing away from the projecting elements 66, there is no planarization layer provided, and on the side of the projecting element 66 facing away from the carrier element 62, there is no film provided. Thus, the thickness of the package 80 may essentially correspond to the thickness of the semiconductor device arrangement 60. Thus, a package that is as thin as possible may be realized. In other examples, a thin planarization layer 70a may be left on the side of the carrier element facing away from the projecting element 66, as is indicated by dashed lines in FIG. 1c.

In examples, before depositing the semiconductor device arrangement, a removable film is deposited onto the surface of the film that is opposite to the film terminal contacts 52, i.e., that faces away from the film terminal contacts 52. The removable film may be removed after depositing the planarization layer. By using such a removable film, handling during manufacturing may be facilitated.

In examples, the film comprises a metallization structure comprising the film terminal contacts according to a terminal contact surface geometry, a contact pad geometry, the semiconductor device arrangement and a fan-out structure leading to larger terminal pads. With this, externally contacting the package may be facilitated by connecting external terminals to the larger terminal pads.

In examples, contact openings may be generated through the film from the surface of the film that is opposite to the film terminal contacts, exposing a metallization connected to the film terminal contacts, e.g., the larger terminal pads. This makes it possible to electrically contact the semiconductor device arrangement in the package in a simple manner by generating a terminal wiring for the semiconductor device arrangement through the openings.

In examples, the openings through the film and/or the contact openings may be easily generated by means of laser cutting.

In examples, the semiconductor device arrangement may be MEMS chip. MEMS is understood to be an microelectromechanical system, wherein usually one or several sensors and/or actuators and control electronics are integrated on a substrate and/or chip. In examples, the MEMS chip may comprise a MEMS substrate in which one or several sensors and/or actuators and a control logic are integrated, and a MEMS cap, which may be a cover of a mechanical component such as a sensor or an actuator. Such a MEMS cap projects from the MEMS substrate representing a carrier element.

In examples, the projecting element may at least comprises one semiconductor chip and the carrier element may comprise a wiring substrate or a semiconductor substrate. In examples, the semiconductor device arrangement may comprise stacked chips. In such examples, the projecting element may comprise a first semiconductor chip and the carrier element may comprise a second semiconductor chip, wherein the first semiconductor chip and the element terminal contacts are arranged on a surface of the second semiconductor chip.

Thus, examples of the present disclosure enable a film-based package (housing) of stacked chips. Possible fields of application are stacked MEMS devices, memory stacks or combinations of processor IC and memory IC as well as further combinations of semiconductor devices. Therefore, the herein-described solution approach generally provides a package solution for two-sheet or multi-sheet chip stacks, e.g., three-dimensional IC stacks or multi-functional chip stacks.

Examples of the present disclosure provide a thin package manufactured using corresponding methods. Examples of the present disclosure provide a thin package for a semiconductor device arrangement comprising a carrier element having arranged thereon a projecting element and element terminal contacts, in a two-sheet film stack, wherein electrically contacting the semiconductor device arrangement to conductive tracks is carried out on the surface of one of the films that faces a second one of the films, by arranging the element terminal contacts on film terminal contacts located on the surface of the one of the films, wherein the conductive tracks are guided onto one of the outer surfaces by means of vias, and wherein the projecting element is arranged in an opening of the one of the two films.

An example of such a package 80 is shown in FIG. 1c, wherein the film 50 represents the one of the two films, and a film formed by the planarization layer 70 represents the second one of the two films. As can be seen in FIG. 1c, contacting is carried out on the side of the film 50 that faces the other film 70, i.e., the inner side.

In examples of a package (housing) according to the present disclosure, the semiconductor device arrangement is a MEMS sensor chip, the projecting element is a MEMS cap, and the carrier element is a MEMS substrate. In examples, the projecting element comprises a semiconductor chip, and the carrier element comprises a further semiconductor chip, a semiconductor substrate or a wiring substrate.

Examples of the present disclosure may be generally applied to semiconductor device arrangements comprising, on a surface of a carrier element, projecting elements such as one or several MEMS caps or one or several semiconductor chips. One or several openings whose outer contour may be adapted to the outer contour of the projecting elements are provided in a film or are to be provided therein. The one or several projecting elements may be introduced into the opening or the openings so that they essentially fill out the opening or the openings. A semiconductor device arrangement is understood to be an arrangement comprising a semiconductor circuit at least either in the carrier element and/or in the projecting element.

Subsequently, an example of a method according to the present disclosure is described in more detail with reference to FIGS. 2a to 10, the semiconductor element arrangement being a MEMS sensor chip.

Such examples enable a flat, or planar, package (housing) for MEMS sensors, which does not change the characteristics of a flow of fluid (gas, air, liquid, water). In this way, no additional turbulences and whirls are generated. Several MEMS sensors may be mounted into the same package. The pressure may be measured at many closely adjacent locations (distance in the range of millimeters) or also as remote locations (distance in the range of several meters).

The overall thickness of the package may be significantly lower than the overall thickness of previous housings of sensors. The entire package is as thick as or not substantially thicker than the MEMS sensor since it consists of only two sheets of film which laterally surround the MEMS sensor without housing and, thus, do not contribute to the thickness, or of a film with one sheet of embedding material which may again be considered as a film. This thickness is preferably in the range of 100 µm to 200 µm. If using thinner MEMS sensors, the thickness may also be reduced down to 40 µm. If a more stable package is desired, the thickness may also be up to 500 µm.

Through the above-described contacting technique, conventional wire bond contacts between the sensor component and the surrounding electronics are no longer required.

Since the package is made from few sheets of foil, it is flexible, i.e., bendable, in contrast to rigid printed circuit boards. It may be mounted onto curved surfaces. It may be packed and sold rolled-up.

FIG. 2a shows a side view and FIG. 2b shows a top view of an example of a MEMS sensor 100 that is to be housed (packaged) and comprises the shape of a staircase. The MEMS sensor 100 comprises a MEMS substrate 102, a MEMS cap 104 and contact pads 106.

As shown in a top view in FIG. 3, a film 120 is provided. For example, the film 120 may consist of PI or PEN or any other electrically non-conductive flexible material. The film 120 may be selected to have the same thickness as the MEMS chip cap 104. The film 120 is or will be provided with a metal layer that is or will be structured in a photo-lithographic manner in order to generate film terminal surfaces 122, which correspond to a contact pad geometry of the MEMS sensor 100, a fan-out structure 124 and larger terminal pads 126. The fan-out structure 124 represents lines that connect the film terminal surfaces 122 with the larger contact pads 126 in an electrically conductive manner.

Figure 4A:
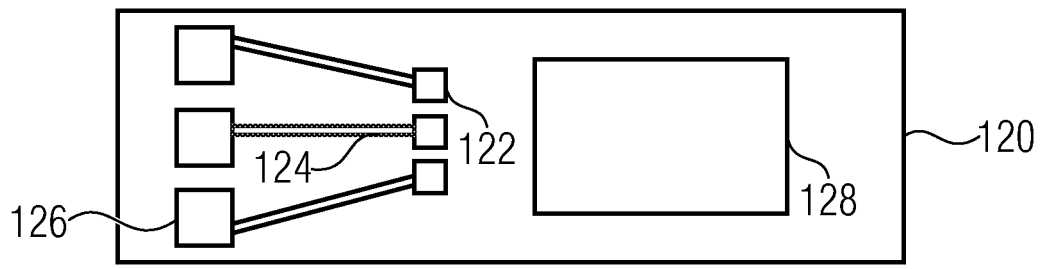
Figure 4B:
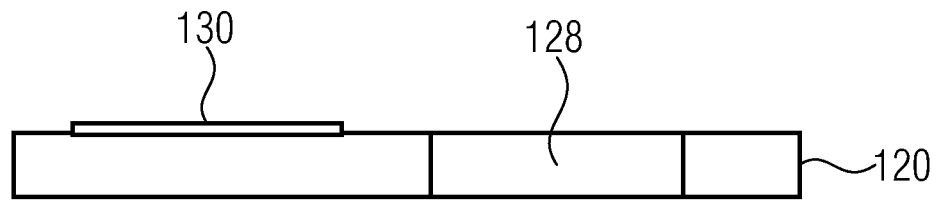

As shown in FIG. 4a as a top view and in FIG. 4b as a cross-sectional view, a hole 128 is cut into the film. At this point, it should be noted that in the cross-sectional views of FIGS. 4 to 10, no hatching is provided for reasons of clarity. For example, the hole may be cut into the film 120 via a laser process. The dimension of the hole 128 roughly corresponds to the size of the MEMS cap 104. In FIG. 4b, the structured metallization layer on the film 120 is referred to with the reference numeral 130.

Figure 5:
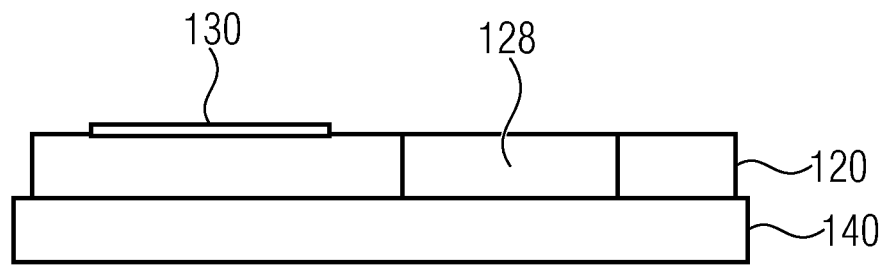

According to FIG. 5, the structured film 120 is temporarily laminated on a removable film 140. For example, the removable film 140 may be a liner film, a saw film, a PET film having a thin adhesive coating, a UV saw film, etc.

Figure 6:
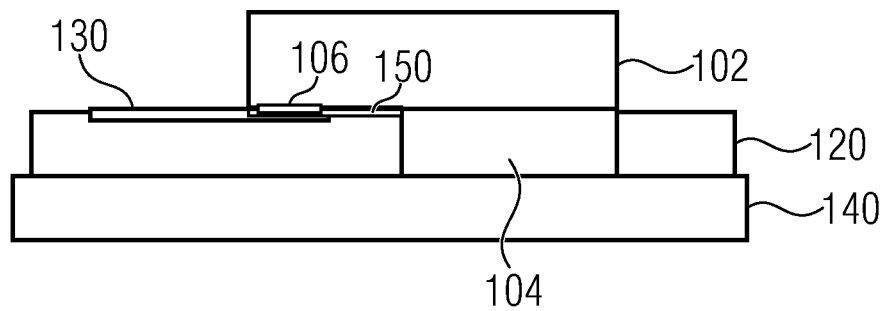

The MEMS sensor 100 is then applied to the side of the structured film 120 facing away from the film 140, as is shown in FIG. 6. In examples, an ACA adhesive 150 (Anisotropic Conductive Adhesive) is dispensed onto the contact pad area or laminated as a dry film. The MEMS sensor 100 is then aligned and placed onto the film terminal surfaces 122 (pads) and the hole 128, e.g., via a pick-and-place process. With this, the contact pads 106 of the MEMS sensor 100 come to rest on the film terminal surfaces 122 and are electrically connected to the same via the conductive adhesive 150.

Figure 7:
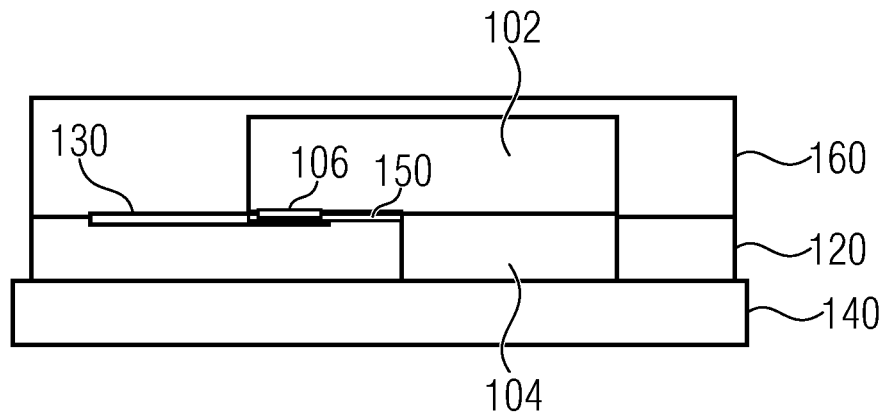

According to FIG. 7, a liquid planarization layer 160 is applied to the surface facing away from the removable film and is cured by annealing, resulting in an almost flat surface topography. For example, the liquid planarization layer may consist of permanent resist, epoxy, polymers or any other suitable material which leads to a flexible layer (film) after curing. In the example shown, a thin part of the planarization layer 160 remains over the MEMS substrate 102 on the side facing away from the MEMS cap. In examples, after depositing and curing the planarization layer 160, thinning the planarization layer, e.g., via chemically-mechanical polishing, may take place so that the side of the MEMS substrate 102 facing away from the MEMS cap 104 is exposed, which may lead to a further reduction of the thickness of the package.

Figure 8:
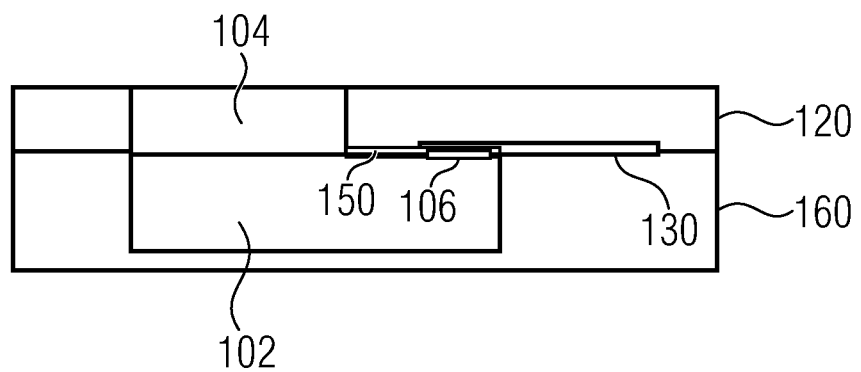

FIG. 8 shows the upside-down film stack, the removable film 140 having been removed.

Figure 9A:
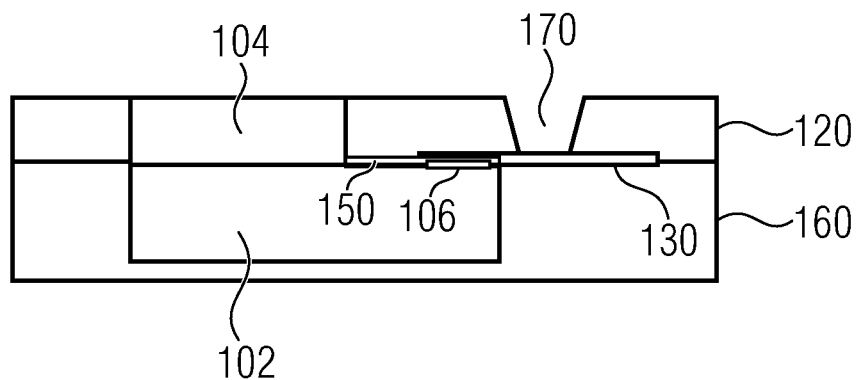
Figure 9B:
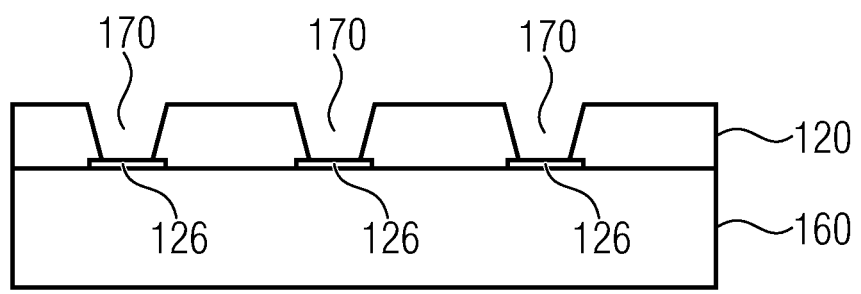

As shown in the lateral cross-sectional view of FIG. 9a and the front cross-sectional view of FIG. 9b, contact holes 170 are then cut through the film 120, e.g., by a laser-via process. The contact holes extend to the underlying metal layer 130, more precisely to the contact pads 126 of this metal layer 130.

Figure 10:
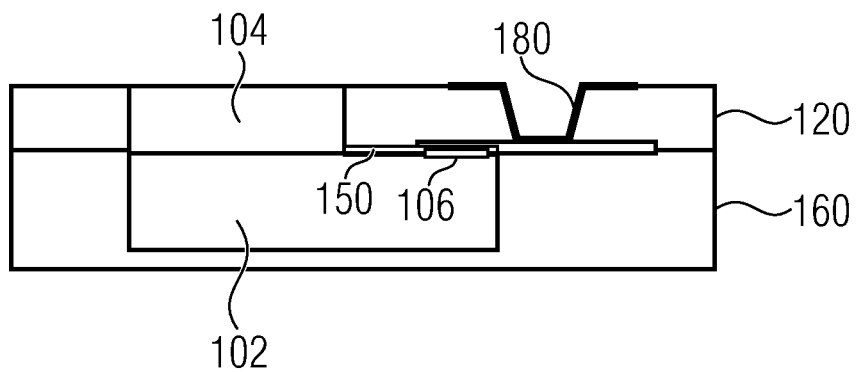

As is shown in FIG. 10, a wiring layer 180 made of metal may be deposited, for example, by a sputtering process, evaporation, etc., in order to contact the MEMS sensor to an external circuit (not shown).

Technical fields of applications of examples of the disclosure are sensors for chemical properties (pH-values, gases and ions in liquids, salt content) and physical properties (temperature, pressure, sound, radiation, acceleration). In particular, examples may be used for flow sensors which are to locally measure the pressure on curved surfaces without changing the characteristic of the flow (turbulent or laminar). For example, the application may be in automotive engineering (design of the car body), and aviation (design of wings or surfaces on the fuselage or tail unit), in wind power plants (design of wings), or in ships (fuselage, propeller or sail).

Examples of the present disclosure generate a thin package for MEMS sensors in a two-sheet film stack, wherein electrically contacting the sensor to conductive tracks takes place on the surface of the one film that faces the second film (inner side), and wherein the conductive tracks are guided by means of vias onto one of the outer surfaces. Examples provide a package for MEMS sensors having a thickness that essentially corresponds to the thickness of the MEMS sensors.

However, the present disclosure is not limited to MEMS sensor applications. Rather, the techniques described herein are also generally applicable to vertically stacked chip arrangement, i.e., three-dimensional stacks, also referred to as "3D-IC" or "3D-chip stacks". In examples, the core idea of the disclosure may be seen in integrating a stack of two or multiple semiconductor devices into a film package that ultimately allows the chip stack to be contacted at a middle level of the chip stack. This possibility of contacting and packaging is not limited to MEMS devices, but may also be used it the same way for other chip stacks, e.g., memory stacks, or combinations of a processor IC and a memory IC, as well as further combinations.

Examples of the present disclosure therefore generally provide a packaged solution for 3D-integrated IC and multi-functional chip stacks for two-sheet and multi-sheet chip stacks. An advantage of examples of the present disclosure is that ultimately a planar chip package is created and the original typography of the semiconductor device arrangement, such as the IC stack, is compensated.

Although some aspects have been described in the context of a method for manufacturing a package, it is clear that these aspects are also a description of a corresponding package. Similarly, aspects that are described in the context of a package may also represent a description of a corresponding characteristic of a corresponding method.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A method for manufacturing a semiconductor device package, comprising:
    providing an electrically insulating film with film terminal contacts on a surface thereof, and an opening therethrough;
    depositing onto the film a semiconductor device arrangement which at least comprises one carrier element having arranged thereon a projecting element and element terminal contacts, wherein the projecting element is introduced into the opening and the element terminal contacts are arranged in contact with the film terminal contacts;
    depositing a planarization layer over the carrier element and the film.

2. The method according to claim 1, wherein the thickness of the film with the planarization layer essentially corresponds the thickness of the semiconductor device arrangement.

3. The method according to claim 1, wherein, before depositing the semiconductor device arrangement, a removable film is deposited onto the surface of the film that is opposite to the film terminal contacts, wherein the removable film is removed after depositing the planarization layer.

4. The method according to claim 1, further comprising generating on the film a metallization structure comprising the film terminal contacts according to a terminal contact surface geometry of the semiconductor device arrangement, and a fan-out structure leading to larger terminal pads.

5. The method according to claim 1, wherein, before depositing the semiconductor device arrangement, an adhesive is applied to the region of the film terminal contacts.

6. The method according to claim 1, further comprising generating contact openings from the surface of the film that opposite to the film terminal contacts, exposing a metallization connected to the film terminal contacts.

7. The method according to claim 6, wherein the opening and/or the contact openings are generated by means of a laser cutting.

8. The method according to claim 6, wherein a terminal wiring for the semiconductor device arrangement is generated through the openings.

9. The method according to claim 1, wherein the semiconductor device arrangement is a MEMS chip, the carrier element is a MEMS substrate and the projecting element is a MEMS cap.

10. The method according to claim 1, wherein the projecting element comprises at least one semiconductor chip, and the carrier element comprises a wiring substrate or a semiconductor substrate.

11. The method according to claim 1, wherein the projecting element comprises a first semiconductor chip, and the carrier element comprises a second semiconductor chip, wherein the first semiconductor chip and the element terminal contacts are arranged on a surface of the second semiconductor chip.

12. A thin package for a semiconductor device arrangement, formed using the method of claim 1, the thin package comprising: a carrier element having arranged thereon a projecting element and element terminal contacts, in a two-sheet film stack, wherein electrically contacting the semiconductor device arrangement to conductive tracks takes place on a surface of one of the films that faces a second one of the films by arranging the element terminal contacts on film terminal contacts that are located on the surface of the one the films, wherein the conductive tracks are guided by means of vias onto one of the outer surfaces, and wherein the projecting element is arranged in an opening of the one of the two films.

13. The thin package for a semiconductor device arrangement according to claim 12, wherein the semiconductor device arrangement is a MEMS sensor chip, the projecting element is a MEMS cap and the carrier element is a MEMS substrate.

14. The thin package for a semiconductor device arrangement according to claim 12, wherein the projecting element comprises a semiconductor chip, and the carrier element comprises a further semiconductor chip, a semiconductor substrate or a wiring substrate.

* * * * *